United States Patent [19]
Lohrmann

[11] Patent Number: 6,101,454
[45] Date of Patent: Aug. 8, 2000

[54] APPARATUS TO OSCILLOGRAPH SINGLE SUB-NANOSECOND EVENTS

[75] Inventor: Dieter R. Lohrmann, Waldorf, Md.

[73] Assignee: The United States of America as represented by the Secretary of the Navy, Washington, D.C.

[21] Appl. No.: 09/207,896

[22] Filed: Nov. 23, 1998

[51] Int. Cl.⁷ .................................................. G01R 29/02
[52] U.S. Cl. ............................ 702/79; 702/67; 324/76.54
[58] Field of Search .......................... 702/79, 57, 66–74, 702/78, 89, 107, 109–112, 124–126, 176, 183, 189, FOR 103, FOR 104, FOR 109, FOR 110; 324/617, 64, 76.13, 76.15, 76.24, 76.35, 76.36, 76.38, 76.54, 76.58, 76.82; 359/140, 110, 127; 700/73, 74; 327/149, 153, 158, 161, 182, 183, 392, 393, 395; 341/122, 123, 137, 139, 142

[56] References Cited

U.S. PATENT DOCUMENTS

| | | | |
|---|---|---|---|
| 4,641,246 | 2/1987 | Halbert et al. | 324/76.54 |
| 5,148,373 | 9/1992 | Dent | 702/72 |
| 5,555,119 | 9/1996 | Lewis | 359/140 |

*Primary Examiner*—Hal Wachsman
*Attorney, Agent, or Firm*—Barry A. Edelbert; Charles J. Stockstill

[57] ABSTRACT

This invention transforms a single sub-nanosecond event into a repetitive event, which then can be used as input to a conventional high bandwidth digital sampling oscilloscope by utilizing a delay line switched to form a closed loop provided with a gain. The single event, as a single pulse of a series of repetitive pulses, is allowed to enter and circulate around the loop where it is amplified and periodically read out to a readout device.

7 Claims, 1 Drawing Sheet

APPARATUS TO OSCILLOGRAPH SINGLE SUB-NANOSECOND EVENTS

BACKGROUND OF THE INVENTION

1. Field of the Invention

This invention pertains generally to a sampling oscilloscope and more specifically to an apparatus to oscillograph a single event of sub-nanosecond duration utilizing a conventional sampling oscilloscope.

2. Description of the Related Art

The frequency response of oscillograph tubes is limited by limitations in the deflection system of the electron ray and the high beam brightness required to make ultra-short events visible on the screen. These limitations have been overcome to a large extent by the invention of the digital sampling oscilloscope. The principle of these oscilloscopes is based on sampling technique, which permits the taking of ultra-short (down to picoseconds) samples of a signal, e.g., using step-recovery diode switches. If samples of a repetitive signal are taken at progressive time intervals in reference to the signal, then, after a sufficient number of samples, the repetitive wave form of the signal can be reconstructed from the samples. Digital sampling oscilloscopes are available that can oscillograph repetitive signals up to 50 GHz. This technique does not work for single events.

SUMMARY OF THE INVENTION

The object of this invention is to provide an apparatus that will allow digital sampling oscilloscopes to oscillograph single sub-nanosecond events by extending the bandwwidth.

This and other objectives is accomplished by transforming the single sub-nanosecond event into a repetitive event, which then can be used as input to a conventional high bandwidth digital sampling oscilloscope by utilizing a delay line switched to form a closed loop provided with a gain, set automatically to one, into which the single pulse is allowed to enter and circulate around the loop. The delay line is tapped to periodically read the pulse out to a readout device; e.g., a digital sampling oscilloscope.

DESCRIPTION OF THE PREFERRED EMBODIMENT

Figure 1:
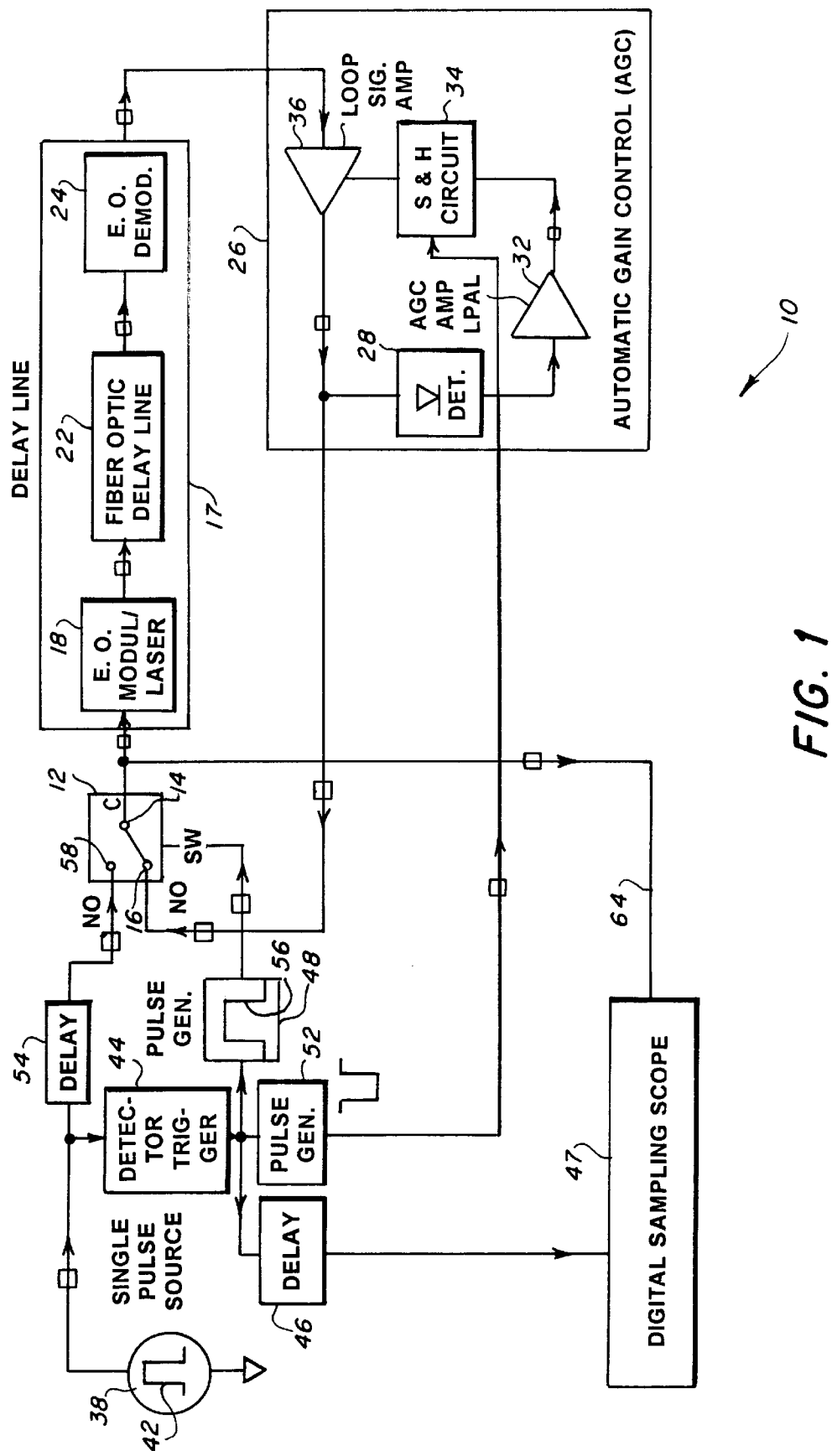
FIG. 1 shows an apparatus for allowing single sub-nanosecond events to be converted into a repetitive event for measurement by a conventional digital sampling oscilloscope.

In the preferred embodiment, the apparatus 10, as shown in FIG. 1, a switch 12 is positioned so as to interconnect terminals C 14 and NC 16 closing a loop formed by an electro-optical modulator/laser 18, fiber optic delay line 22, electro-optic demodulator 24 and automatic gain control (AGC) amplifier 26. The loop gain is adjusted such that at first, it is slightly above 1, e.g., 1.1. Under this condition, self-excitation of the loop occurs with exponentially rising amplitude, which increases until the AGC 26 comprised of detector 28, AGC amplifier/low pass filter 32, sample and hold circuit 34 and loop signal amplifier 36 act to stabilize the signal amplitude. After the loop has stabilized, the loop gain is exactly equal to one.

The source 38 of the single pulse to be oscillographed emits a pulse 42, a detector-trigger 44 provides a pulse a trigger of a digital sampling oscilloscope (DSO) 47 after delay 46. Also a first and second pulse generator 48 and 52, respectively, are triggered. The pulse 42 from the single pulse source 38 is also applied to the switch 12 thru delay line 54.

The output pulse 56 of the first pulse generator 48 switches switch 12 to a position connecting C 14 and NO 58 completing a circuit between the output of delay line 54 and the electro-optical (E/O) modulator/laser 18 and the input to the DSO 47. The laser optical signal within the electro-optic modulator/laser 18 is modulated by the pulse 42 forming a modulated optical pulse which is applied to the fiber optic delay line 22. Also, the output pulse of the second pulse generator 52 opens the AGC 26 loop by switching the S&H circuit 34 to "HOLD", maintaining the loop gain equal to 1.

Until the pulse 42 exits the delay line 54, the output of the delay line 54 is zero, transmitting zero level into the fiber optic delay line (FODL) 22 via the switch 12. The delay of delay line 54 is chosen such that it slightly exceeds the delay in the FODL 22. Therefore, when the signal pulse 42 exits the delay line 54, the FODL 22 is empty.

After the modulated optical signal pulse from the electro-optical modulator/laser 18 has entered the FODL 22, switch 12 is switched so as to interconnect positions C 14 and NC 16, thereby closing the FODL 22 loop. Now the modulated optical pulse circulates around the loop and is repetitively appearing at the input 64 of the DSO 47. This allows the DSO 47 to receive a sequence of pulses, derived from the single pulse 42.

Due to noise introduced into the delay line loop 17 comprised of the electro-optical modulator/laser 18, fiber optic delay line 22 and electro-optical demodulator 24 loop, noise is added to the signal every time the signal travels around the loop 17. With a maximum input power to the delay line 17 of typically 20 dBm and a dynamic range of 65 dB/MHz, the maximum time the pulse can travel around the delay line 17 is 1 ms, before it is destroyed by noise. Since the maximum delay time needed is in the order of only 20 ns, the noise problem can be overcome by proper design utilizing techniques well known to those skilled in the art.

The delay line 17 comprised of electro-optical modulator/laser 18, fiber optic delay line 22 and electro-optical demodulator 24 can be replaced by other types of delay lines, e.g., transverse electro magnetic (TEM), coaxial, microstrip, delay lines, provided the dispersion is sufficiently low.

The readout device need not be a digital sampling oscilloscope 47, it may be any other device producing oscillograph periodic signals.

This invention allows for a single event of sub-nanosecond duration to be oscilloscoped by a conventional sampling oscilloscope.

The device set forth may be applied to oscillograph subnanosecond single laser pulses. The optical pulse is converted into an electrical pulse utilizing techniques well known to those skilled in the art, ad then applied to the claimed device.

Although this invention has been described in relation to an exemplary embodiment thereof, it will be understood by those skilled in the art that still other variations and modifications can be affected in the preferred embodiment without detracting from the scope and spirit of the invention as described in the claims.

What is claimed:

1. An apparatus to read a sub-nanosecond single pulse shape comprised of:

means for forming a delay line into a closed electrical circuit forming a loop;

means for applying a sub-nanosecond single event pulse to the delay line;

means for automatically setting the closed loop's gain so as to increase the amplitude of the sub-nanosecond single event pulse to a desired amplitude;

means of opening the closed loop to allow the sub-nanosecond single event pulse to enter the closed loop and to close the loop after the sub-nanosecond single event pulse has entered so as to allow the sub-nanosecond single event pulse to oscillate around the closed loop; and means to sample the oscillating sub-nanosecond single event pulse in the delay line so as to periodically read the sub-nanosecond single event pulse shape on a display device.

2. An apparatus, as in claim 1, wherein the delay line is made of a fiber optic fiber.

3. An apparatus, as in claim 1, wherein the delay line is a transverse electro magnetic type electrical transmission line.

4. An apparatus, as in claim 1, wherein the means for automatically setting closed loop gain so as to increase the amplitude of the sub-nanosecond single event pulse to a desired amplitude is an automatic gain control circuit.

5. An apparatus, as in claim 1, wherein the means of opening the closed loop to allow the sub-nanosecond single event pulse to enter the closed loop and to close the loop after the sub-nanosecond single event pulse has entered so as to allow the sub-nanosecond single event pulse to oscillate around the closed loop is an electronic switch.

6. An apparatus, as in claim 1, wherein the means to sample the oscillating sub-nanosecond single event pulse in the delay line so as to periodically read the sub-nanosecond single event pulse shape on a display device is a digital sampling oscilloscope.

7. A method to read a sub-nanosecond single event pulse shape comprised of:

forming a delay line into a closed electrical loop;

applying a series of single event pulses to the delay line;

increasing the amplitude of an applied sub-nanosecond single event pulse to set the closed loop's gain automatically to a predetermined value;

opening the closed loop to allow the applied sub-nanosecond single event pulse to enter the closed loop and to close the loop after the applied sub-nanosecond single event pulse has entered so as to allow the applied sub-nanosecond single event pulse to oscillate around the closed loop; and sampling the oscillating applied sub-nanosecond single event pulse in the delay line so as to periodically read the applied sub-nanosecond single event pulse shape on a display device.

* * * * *